United States Patent [19]
Cheung et al.

[11] Patent Number: 5,158,644
[45] Date of Patent: Oct. 27, 1992

[54] REACTOR CHAMBER SELF-CLEANING PROCESS

[75] Inventors: David Cheung, Foster City; Peter Keswick, Newark; Jerry Wong, Fremont, all of Calif.

[73] Assignee: Applied Materials, Inc., Santa Clara, Calif.

[21] Appl. No.: 777,423

[22] Filed: Oct. 10, 1991

Related U.S. Application Data

[63] Continuation of Ser. No. 546,299, Jun. 29, 1990, abandoned, which is a continuation-in-part of Ser. No. 455,799, Dec. 19, 1989, Pat. No. 4,960,488, which is a continuation of Ser. No. 67,210, Jun. 26, 1987, abandoned, which is a continuation-in-part of Ser. No. 944,492, Dec. 19, 1986, Pat. No. 5,000,113.

[51] Int. Cl.$^5$ .......................... B08B 7/00; C23F 1/12; H01L 21/306
[52] U.S. Cl. .................... 156/643; 156/345; 134/1; 204/298.31; 204/298.33
[58] Field of Search ............. 156/643, 646, 652, 345; 134/1; 437/228, 238, 243; 204/298.31, 298.33

[56] References Cited

U.S. PATENT DOCUMENTS

| | | | |
|---|---|---|---|
| 4,138,306 | 2/1979 | Niwa | 156/345 |
| 4,529,474 | 7/1985 | Fujiyama et al. | 156/643 |
| 4,534,816 | 8/1985 | Chen et al. | 156/345 |
| 4,576,698 | 3/1986 | Gallagher et al. | 204/192 |
| 4,657,616 | 4/1987 | Benzing et al. | 156/345 |
| 4,960,488 | 10/1990 | Law et al. | 156/643 |

FOREIGN PATENT DOCUMENTS

| | | |
|---|---|---|
| 0266288 | 5/1988 | European Pat. Off. |
| 0272140 | 6/1988 | European Pat. Off. |
| 0272142 | 6/1988 | European Pat. Off. |
| 0296891 | 12/1988 | European Pat. Off. |
| 7720766 | 2/1979 | France |
| 85-02167 | 11/1986 | PCT Int'l Appl. |
| 87-07309 | 12/1987 | PCT Int'l Appl. |

OTHER PUBLICATIONS

Patent Abstracts of Japan, vol. 7, No. 49, Feb., 1983.
Solid State Technology, May, 1987, pp. 81-83.
Patent Abstracts of Japan, vol. 13, No. 251, Jun., 1989.
Patent Abstracts of Japan, vol. 13, No. 388, Aug., 1989.

*Primary Examiner*—W. Gary Jones
*Assistant Examiner*—Todd J. Burns
*Attorney, Agent, or Firm*—Philip A. Dalton

[57] ABSTRACT

A reactor chamber self-cleaning process is disclosed which uses a fluorocarbon-containing gas and, preferably, $C_2F_6$ in combination with oxygen. The two-step process involves, first, a chamber-wide etch at relatively low pressure and with relatively large separation between the gas inlet manifold and the wafer supports which are the RF electrodes and, second, a local etch step which uses a relatively high chamber pressure and smaller electrode spacing, to complete the cleaning of the RF electrodes.

12 Claims, 2 Drawing Sheets

REACTOR CHAMBER SELF-CLEANING PROCESS

BACKGROUND OF THE INVENTION

This patent application is a continuation of Ser. No. 546,299 filed Jun. 29, 1990, now abandoned, which is a continuation-in-part of co-pending allowed U.S. patent application Ser. No. 455,799, filed Dec. 19, 1989, now U.S. Pat. No. 4,960,488, in the name of Law et al, entitled REACTOR CHAMBER SELF-CLEANING PROCESS (hereafter Law et al); which is a continuation of co-pending U.S. patent application Ser. No. 067,210, filed Jun. 26, 1987, in the name of Law et al, entitled REACTOR CHAMBER SELF-CLEANING PROCESS, now abandoned; which is a continuation-in-part of co-pending U.S. patent application Ser. No. 944,492, filed Dec. 19, 1986, now U.S. Pat. No. 5,000,113, in the name of Wang et al, entitled THERMAL CVD/PECVD REACTOR AND USE FOR THERMAL CHEMICAL VAPOR DEPOSITION OF SILICON DIOXIDE AND IN-SITU MULTI-STEP PLANARIZED PROCESS (hereafter Wang et al).

The present invention relates to a reactor and methods for performing single and in-situ multiple integrated circuit processing steps, including thermal CVD, plasma-enhanced chemical vapor deposition (PECVD), film etchback and reactor self-cleaning. In particular, the present invention also relates to dry process sequences for self-cleaning the reactor in-situ without disassembling the reactor or using time-consuming, wet chemical cleaning.

The reactor described herein and in the Wang et al and Law et al applications is adapted for processing very small geometry devices which are very susceptible to even small amounts of very small particulates. Although this reactor operates at relatively higher pressure than conventional reactors, it creates long-lived species which may still deposit in the exhaust system and in downstream exhaust system components to the throttle valve. Thus, although the operation of this reactor is cleaner than conventional reactors and although cleaning can be done less frequently, it is very desirable to be able to employ self-cleaning techniques to clean the reactor chamber, including the walls, and the vacuum system. The purposes include preventing contamination of particulate-sensitivity small geometry devices and ensuring long-term survival and reproducible operation of chamber and reactor hardware such as the gas inlet manifold faceplate, wafer support hardware and the throttle valve (collectively termed "hardware"). In particular, it is highly desirable to have a reactor self-cleaning process which is distinct from existing processes in that it provides effective cleaning, uses non-toxic gases, and is relatively non-corrosive of the reactor hardware.

SUMMARY OF THE INVENTION

1. Objects

It is an object of the present invention to provide a versatile wafer processing reactor self-cleaning process which is relatively non-corrosive of the reactor hardware, and which effectively cleans the reactor using non-toxic gases.

It is a related object to provide a plasma reactor self-cleaning process technology which is applied in-situ without disassembling or removing chamber components.

It is a related object to provide a process for cleaning a reactor chamber and its exhaust system in-situ, in a single continuous process sequence of extended area etch followed by local area etch.

2. Summary

In one aspect, the present invention relates to a self-cleaning process for wide area cleaning of the chamber components and exhaust system components of an RF powered reactor chamber comprising communicating into the chamber via the gas manifold a gas including constituents selected from fluorocarbon gas and fluorocarbon gas doped with the reactant gas oxygen, while applying RF power to the chamber electrodes for forming an etching gas of the gas and maintaining the chamber at a pressure selected for establishing the etching plasma throughout the chamber and into the exhaust system.

In another aspect, the present invention relates to a self-cleaning process for locally cleaning the gas distribution manifold and electrodes of an RF powered reactor chamber comprising communicating into the chamber via the gas manifold a gas including constituents selected from fluorocarbon gas and fluorocarbon gas doped with the reactant gas oxygen while applying RF power to the chamber electrodes for forming an etching gas of the mixture and maintaining the chamber at a pressure sufficiently high for etching deposits from the gas manifold and electrodes.

In still another aspect, the present invention relates to the use of the above extended and local area cleaning steps in combination to provide extended and local cleaning of the chamber and exhaust.

The invention also encompasses a method of using an RF powered reactor chamber having a gas inlet manifold and a vacuum outlet system, employing self-cleaning, comprising: first, depositing or repetitively depositing a layer on a substrate positioned within the chamber; and secondly, applying the above extended area and local cleaning process.

In one specific aspect, our invention is embodied in a process for self-cleaning a vacuum processing reactor having a gas inlet manifold electrode and a wafer support electrode of variable spacing therebetween, and comprises: in a first, extended etch step, supplying a fluorocarbon-containing gas into the chamber at a first relatively low pressure and a first relatively large electrode spacing, with selected power applied between the electrodes, for generating an etching plasma substantially throughout the chamber; and, in a second, local etch step, supplying the fluorocarbon-containing gas into the chamber at a second relatively high pressure and a second relatively small electrode spacing, with selected power applied between the electrodes, for generating a local etching plasma between the electrodes. The first, extended etch step may use a $C_2F_6$ flow rate of about 300–600 sccm, $O_2$ flow rate about 400–800 sccm, pressure about 0.8–2 torr, electrode spacing about 1,000 mils and RF power about 500–750 watts; and the second, extended etch step may use a $C_2F_6$ flow rate of about 600–800 sccm, $O_2$ flow rate about 700–900 sccm, pressure about 6–13 torr, electrode spacing about 180–300 mils and RF power about 500–750 watts. Preferably, the first, extended etch step uses the gases $C_2F_6$ and $O_2$ at a $C_2F_6:O_2$ flow rate ratio of (0.75–1.30):1, electrode spacing 750–1,000 mils, pressure 0.8–2 torr and power density 2.7–5.6 watts/cm$^2$;

and the second, local etch step uses the gases $C_2F_6$ and $O_2$ at a $C_2F_6:O_2$ flow rate ratio of (0.85–1):1, electrode spacing 180–350 mils, pressure 6–13 torr and power density 2.7–5.6 watts/cm$^2$.

In still another aspect, our invention is embodied in a process for depositing dielectric coatings such as silicon oxide on semiconductor wafers in a vacuum reactor having a gas inlet manifold electrode and a wafer support electrode of variable spacing therebetween, and for self-cleaning the reactor, and comprises: depositing one or more coatings on a wafer in the chamber; and then self-cleaning the internal reactor surfaces, by, first, supplying a fluorocarbon-containing gas into the chamber at a first relatively low chamber pressure and a first relatively large electrode spacing with selected RF power applied between the electrodes, for generating an etching plasma substantially throughout the chamber; and, second, increasing the chamber pressure to a second relatively high value, decreasing the electrode spacing to a second relatively low value with selected power applied between the electrodes for generating a local etching plasma between the electrodes.

BRIEF DESCRIPTION OF THE DRAWINGS

The above and other aspects and advantages of the present invention are described in conjunction with the following drawing figures, in which.

DETAILED DESCRIPTION OF THE PREFERRED EMBODIMENT(S)

1. Exemplary PECVD Reactor 10

Figure 1:
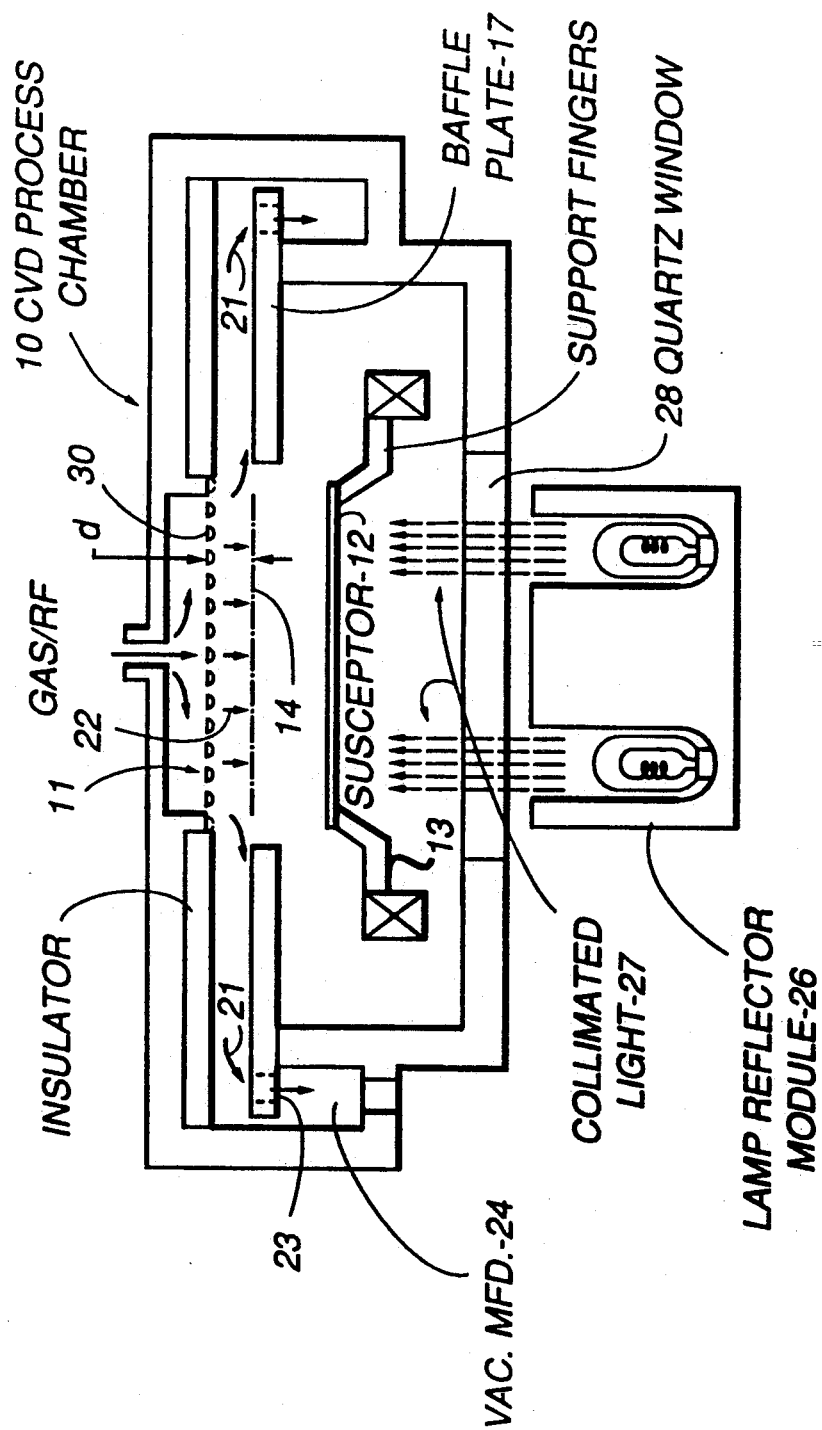
FIG. 1 is a top plan view of a combined CVD/PECVD reactor used in practicing the present invention.

FIG. 1 schematically depicts a parallel plate CVD (chemical vapor deposition) reactor 10 which incorporates a gas inlet manifold 11 made according to the present invention. The reactor 10 is described in the aforementioned co-pending U.S. patent application Ser. No. 944,492, entitled THERMAL CVD/PECVD CHEMICAL REACTOR AND USE FOR THERMAL CHEMICAL VAPOR DEPOSITION ON SILICON DIOXIDE AND IN-SITU MULTI-STEP PLANARIZED PROCESS, filed Dec. 19, 1986 in the name of Wang et al, now U.S. Pat. No. 5,000,113. The Wang et al and the aforementioned Law et al patent applications are hereby incorporated by reference in their entirety (hereafter "referenced Wang et al patent applications" and "referenced Law et al patent applications"). Reactor 10 contains a highly thermally responsive susceptor 12 which preferably is mounted on a vertically reciprocal cantilevered beam or support fingers 13 so that the susceptor 12 (and the wafer supported on the upper surface of the susceptor) can be controllably moved between a lower loading/off-loading position and an upper processing position 14 which is closely adjacent the inlet manifold 11.

When the susceptor 12 and the wafer are in the processing position 14, they are surrounded by a baffle plate 17 having a plurality of circularly spaced holes 23 which exhaust into annular vacuum manifold 24.

As a result of the high pressure capability of the reactor 10, the baffle plate 27, etc., during processing, gas inlet to the manifold along paths 22 is distributed radially uniformly along the susceptor and wafer, as indicated at 21, then is exhausted via the ports 23 into the circular vacuum manifold 24 by the vacuum pump system. A controlled plasma is formed adjacent the wafer by RF energy applied to the inlet manifold 11, which is also an RF electrode. A circular external lamp module 26 provides a collimated annular pattern 27 of light via quartz window 28 onto an annular outer peripheral portion of the susceptor 12, thereby compensating for the natural heat loss pattern of the susceptor and providing rapid and uniform susceptor and wafer heating for effecting deposition.

Typically, any or all of the gas inlet manifold faceplate, the susceptor support fingers, wafer transfer fingers (not shown) and various other reactor hardware may be made of material such as aluminum, covered with dielectric such as anodized aluminum oxide surface coating.

The variable close spacing, d, between the manifold faceplate 30 and the wafer 14 supported on susceptor 12, as well as the various other features described in detail in the referenced Wang et al patent application, including the high pressure capability, the wide pressure regime and the uniform radial gas flow, all combine to provide a wide range of processing capability to reactor 10. This processing versatility includes oxide film deposition using plasma-enhanced TEOS gas chemistry and/or ozone/TEOS gas chemistry; high rate isotropic etching; film planarization; and reactor self-cleaning.

2. Exemplary Silicon Oxide Deposition

A present working process for depositing silicon dioxide on four-six inch wafers uses TEOS in helium flow rate of 250–600 sccm, oxygen 250–600 sccm, RF power 350–450 watts, electrode spacing 170–220 mils, chamber pressure 8–10 torr and susceptor temperature of 390°–410° C. (the susceptor temperature range is maintained by controlling the power to the heating lamps).

3. Chamber System Self-Cleaning

The present invention encompasses a localized chamber self-etch and a wide area chamber self-etch. The local etch is used to clean the RF electrodes, i.e., the susceptor 12 and the inlet gas manifold faceplate 30. The extended or wide area etch preferably cleans the entire chamber including the downstream vacuum system.

The self-cleaning process comprising the extended area etch and the local area etch steps is further characterized by the use of the same gas chemistry in both steps. Fluorocarbon gas chemistry is used and preferably, a fluorocarbon such as $C_2F_6$ and a reactant gas such as oxygen.

The two in-situ etch steps use the wide pressure capability and the variable close electrode spacing of the present reactor 10 in combination with the fluorocarbon gas chemistry. Specifically, the extended area etch step uses relatively low chamber pressure, relatively large electrode spacing, selected RF power levels applied between the electrodes 12 and 30 and selected etch gas mixture flow rates and other parameters. The process is conveniently switched to the local area etch step by increasing the pressure and decreasing the electrode spacing with adjustments as required in the associated RF power, etchant gas flow rates and other parameters.

In short, the two etch steps are implemented in seriatim in the reactor without breaking vacuum or changing gases by the simple expedient of adjusting selected process parameters.

Preferably, the extended area etch is used first to clean the entire chamber including the walls and hardware and then the local area step is used to clean the electrodes 12 and 30. During the extended area cleaning, the relatively thickly-coated electrodes 12 and 30 are partially cleaned; the local area etch step finishes the cleaning of the electrodes. A majority of erosion of hardware protective dielectric coatings such as anodization occurs during the low pressure extended etch step. By applying the extended area cleaning step first, the local electrodes such as the faceplate of manifold 30 are protected by the deposited oxide thereon. That oxide is then removed during the subsequent, high pressure localized etch step, with minimal erosion outside the localized region of etching.

In short, the so-called extended area first sequence has the advantage of avoiding over-etching, because the subsequent local area etch does not over-etch the previously cleaned regions outside the electrodes. In contrast, were the local etch applied first to clean the electrodes 12 and 30, the inherent chamber-wide cleaning-/erosion during the subsequent low pressure extended area etch step would somewhat over-etch the unprotected local hardware such as the faceplate of the electrode 30 and the thin dielectric coatings thereon and, consequently, would diminish the lifetime of such components and the reproducible process lifetime.

Such cleaning capability is advantageous for any reactor. It is particularly advantageous for the reactor 10, which, as mentioned, is adapted for processing very small geometry devices, which are susceptible to damage caused by particulates. Although the reactor 10 operates at relatively higher pressure than conventional reactors, it nonetheless may create long-lived species which deposit in the vacuum exhaust system and in downstream vacuum system components to and including the throttle valve. Thus, while the operation of the preferred reactor 10 is cleaner than conventional reactors and while cleaning can be done less frequently, the ability to clean both the vacuum system and the reactor chamber rapidly and frequently, if necessary, is very desirable in preventing particulate contamination and in ensuring long-term proper operation of components such as the throttle valve.

The extended or wide area self-cleaning process uses a relatively low pressure, and relatively large electrode spacing and fluorocarbon gas chemistry for etching the entire chamber as well as the vacuum system components at a high rate. These components include, but are not limited to, in addition to the susceptor 12 and manifold 30 and related components, the window 28, the baffle flow control plate 17 and the exhaust holes 23 therein, the vacuum exhaust channel 24 and in general the components along the exhaust path at least to and including the associated throttle valve (not shown).

The localized self-cleaning step or process uses a fluorocarbon gas etch chemistry, relatively high pressure and relatively close spacing between the electrodes 12 and 30 (the spacing is similar to that used for deposition), to provide the desired high etch rate and stable plasma for fast local cleaning of the electrodes 12 and 30 and nearby chamber components.

In a presently preferred embodiment, for a quasi-parallel configuration for four-eight inch wafers, the first, extended area etch step comprises communicating the fluorocarbon, $C_2F_6$ and oxygen etching gas mixture into the reactor chamber at flow rates within the range of about 300–600 sccm and 400–800 sccm (flow rate ratio about 0.75:1), respectively, at a pressure of about 0.8 to 2 torr, using an electrode spacing of about 1,000 mils, and 13.56 MHz RF power of about 500–730 watts (which provides RF power density of about 3.8–3.9 watts/cm$^2$), to clean both the entire chamber and the downstream components. Optionally, $NF_3$ may be added at flow rates approximately 10% of the $C_2F_6$ flow. It should be noted that the relatively lower pressure and the greater electrode spacing facilitates extending (in comparison to the local etch step) or spreading the cleaning plasma throughout the chamber and downstream. This step cleans chamber deposits resulting from one micron of silicon oxide deposition in about 30–40 seconds.

In a presently preferred embodiment, also for a quasi-parallel configuration for four-eight inch wafers, the second, local area etch step comprises communicating a fluorocarbon and oxygen etching gas mixture into the reactor chamber at respective flow rates of about 600–800 sccm and 700–900 sccm (flow rate ratio about 0.85:1), at a pressure within the range 6–13 torr, using RF power of about 500–750 watts to provide an RF power density within the range of about 3.8–3.9 watts/cm$^2$ at a frequency of 13.56 megahertz, and using an electrode spacing of about 180–300 mils, to clean the chamber locally. The relatively higher pressure and the smaller electrode spacing effectively confines the cleaning plasma to the region between the electrodes 12 and 30. This step cleans local deposits resulting from one micron of silicon oxide deposition in about 30–40 seconds.

Anticipated useful parameter ranges for a four-eight inch wafer configuration of the exemplary reactor 10 are, (1) for the extended area etch step: $C_2F_6:O_2$ flow rate ratios about (0.75–1.30):1, $C_2F_6$ flow rate 300–1,200 sccm, $O_2$ flow rate 400–950 sccm, electrode spacing 750–1,000 mils, pressure 0.8–2 torr and power density about 2.7–5.6 watts/cm$^2$; and (2) for the local clean step: $C_2F_6:O_2$ flow rate ratios of about (0.85–1):1, $C_2F_6$ flow rate 600–950 sccm, $O_2$ flow rate 700–1,000 sccm, electrode spacing 180–350 mils, pressure 6–13 torr and power density 2.7–5.6 watts/cm$^2$.

4. Summary of Certain Key Advantages

In addition to the aforementioned advantages of ease of use, extended reproducible processing lifetime and extended hardware lifetime, our process has a number of other advantages. First, the process uses relatively inexpensive process gases such as $C_2F_6$ and $O_2$. Also, the process is non-toxic, i.e., the process gases $C_2F_6$ and $O_2$ are non-toxic. Furthermore, the process is a relatively mild one in that it is relatively non-corrosive of reactor hardware.

Capital costs are decreased by at least three of the previously-mentioned factors. First, hardware lifetime is increased because the process is relatively non-corrosive to the chamber hardware. Secondly, the use of the extended area first, local area second sequence decreases over-etching of the electrodes. Thirdly, the non-toxic nature of the process reduces or eliminates the need for expensive safety monitoring equipment.

As alluded to previously, the reduced corrosion of hardware provides long-term process stability in that the processing time is increased (i.e., a greater amount of deposition is possible) before the chamber must be opened and the interior components cleaned by wet etching or the like.

In short, our process is convenient to use, easy to implement, decreases reactor downtime for maintenance and cleaning and increases hardware lifetime and processing stability lifetime.

Figure 2:
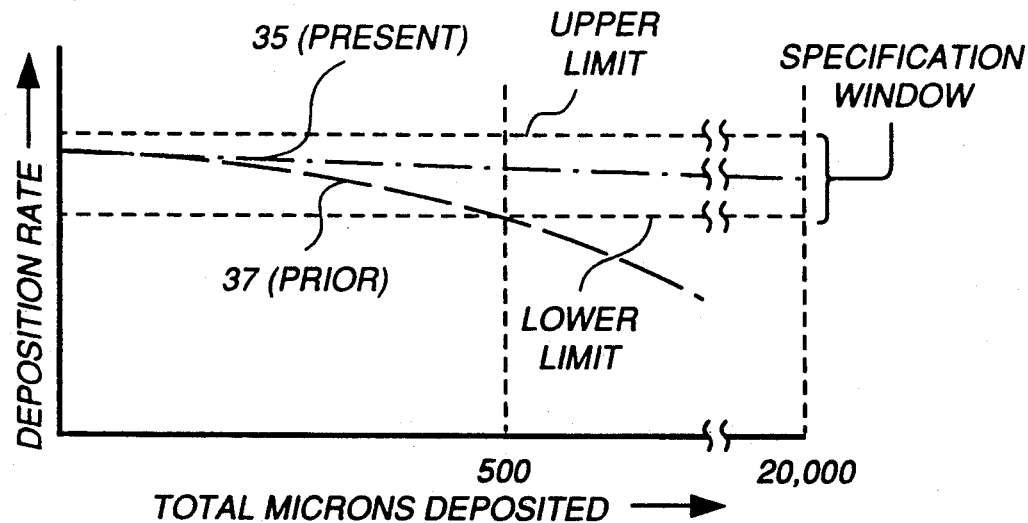
FIG. 2 depicts graphs of deposition rate vs. total deposition for both our present cleaning process and prior processing.
Figure 3:
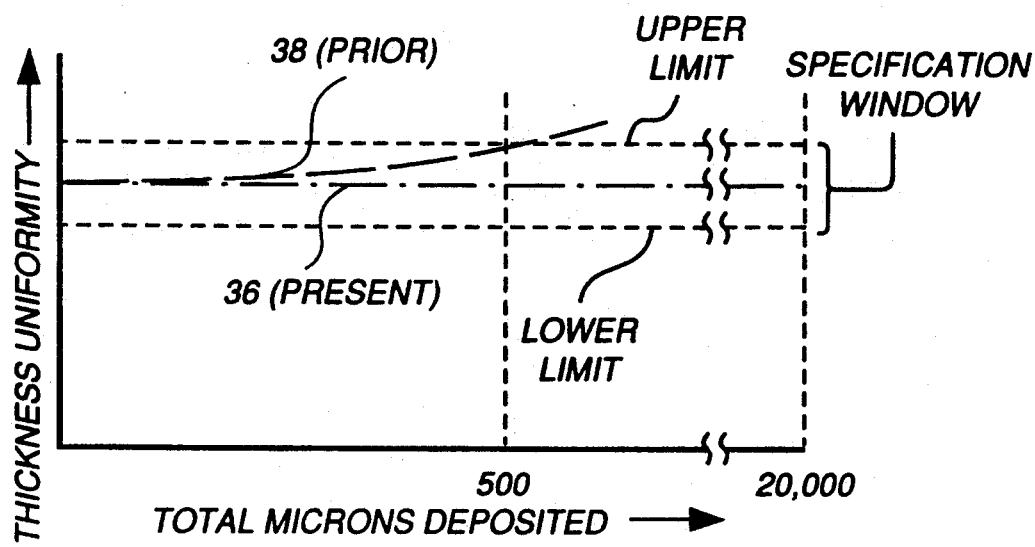
FIG. 3 depicts graphs of thickness uniformity vs. total deposition for both our present cleaning process and prior processing.

Using the above-presently preferred process parameters to self-clean the chamber 10 after every wafer deposition has extended process reproducibility lifetime, i.e., the interval between wet cleaning, to a minimum of 2,000 microns of deposition. Also, hardware lifetime, i.e., lifetime between maintenance or replacement, has been extended to at least 30,000 microns. In comparison, previous self-cleaning processes provided deposition of 500 microns before wet cleaning and hardware lifetime of about 5,000 microns. FIGS. 2 and 3 depict graphs 35-38 which compare the process reproducibility versus total deposition for, respectively, the present process and prior processing.

Parameters such as power and flow for the four-eight inch wafer configurations will be readily scaled upward or downward for larger or smaller wafers. Also, we anticipate that flow rates and ratios given here can be readily adapted to other reactors.

While this invention has been described above in connection with various preferred and alternative embodiments, it is understood that persons of skill in the art can make numerous modifications without departing from the scope of the invention as claimed in the following claims.

We claim:

1. A process for self-cleaning a vacuum processing reactor chamber having electrodes in the form of a gas inlet manifold and a wafer support electrode of variable spacing therebetween, comprising: in a first, extended etch step, supplying a fluorocarbon-containing gas into the chamber at a first pressure and a first electrode spacing, with selected power applied between the electrodes, for generating an etching plasma substantially throughout the chamber; and, in a second, local etch step, supplying the fluorocarbon-containing gas into the chamber at a second pressure greater than the first pressure, and a second electrode spacing which is less than the first electrode spacing, with selected power applied between the electrodes, for generating a local etching plasma between the electrodes.

2. The process of claim 1, wherein the first, extended etch step uses the gases $C_2F_6$ and $O_2$ at a $C_2F_6:O_2$ flow rate ratio of (0.75-1.30):1, electrode spacing 750-1,000 mils, pressure 0.8-2 torr and power density 2.7-5.6 watts/cm$^2$.

3. The process of claim 1, wherein the second, local etch step uses the gases $C_2F_6$ and $O_2$ at a $C_2F_6:O_2$ flow rate ratio of (0.85-1):1, electrode spacing 180-350 mils, pressure 6-13 torr and power density 2.7-5.6 watts/cm$^2$.

4. A process for self-cleaning a vacuum processing reactor chamber having RF electrodes in the form of a gas inlet manifold and a wafer support electrode of variable spacing therebetween, comprising: in a first, extended etch step supplying the gases $C_2F_6$ and $O_2$ into the chamber at a $C_2F_6:O_2$ flow rate ratio of approximately (0.75-1.30):1, at a chamber pressure of approximately 0.8-2 torr and an electrode spacing of approximately 750-1,000 mils, with RF power density of approximately 2.7-5.6 watts/cm$^2$ applied between the electrodes for generating an etching plasma substantially throughout the chamber; and, in a second, local etch step, increasing the chamber pressure to a value of approximately 6-13 torr, decreasing the electrode spacing to a value of approximately 180-350 mils with selected RF power density of approximately 2.7-5.6 watts/cm$^2$ applied between the electrodes and wherein the $C_2F_6:O_2$ flow rate ratio is approximately (0.85-1):1, for generating a local etching plasma between the electrodes.

5. The process of claim 1, wherein the first, extended etch step uses $C_2F_6$ flow rate of about 300-600 sccm, $O_2$ flow rate about 400-800 sccm, pressure about 0.8-2 torr, electrode spacing about 1,000 mils and RF power about 500-750 watts.

6. The process of claim 5, wherein the $C_2F_6:O_2$ flow rate ratio is 0.75:1 and the RF power density is 3.8-3.9 watts/cm$^2$.

7. The process of claim 1, wherein the second, extended etch step uses a $C_2F_6$ flow rate of about 600-800 sccm, $O_2$ flow rate about 700-900 sccm, pressure about 6-13 torr, electrode spacing about 180-300 mils and RF power about 500-750 watts.

8. The process of claim 7, wherein the $C_2F_6:O_2$ flow rate ratio is 0.85:1 and the RF power density is about 3.8-3.9 watts/cm$^2$.

9. A process for self-cleaning a vacuum processing reactor chamber having RF electrodes in the form of a gas inlet manifold and a wafer support electrode of variable spacing therebetween, comprising: in a first, extended etch step supplying the gases $C_2F_6$ and $O_2$ into the chamber at respective flow rates 300-600 sccm and 400-800 sccm, at a chamber pressure of approximately 0.8-2 torr, electrode spacing of approximately 1,000 mils, with RF power density of approximately 2.7-5.6 watts/cm$^2$ applied between the electrodes, for generating an etching plasma substantially throughout the chamber; and, in a second, local etch step, increasing the chamber pressure to approximately 6-13 torr, decreasing the electrode spacing to approximately 80-300 mils with selected RF power of approximately 2.7-5.6 watts/cm$^2$ applied between the electrodes and wherein the $C_2F_6$ and $O_2$ flow rates are approximately 600-800 sccm and 700-900 sccm, respectively, for generating a local etching plasma between the electrodes.

10. The process of claim 9, wherein during the first, extended etch step, the $C_2F_6:O_2$ flow rate ratio is 0.75:1, during the second, local etch step, the $C_2F_6:O_2$ flow rate ratio is 0.85:1, and during both steps the RF power density is about 3.8-3.9 watts/cm$^2$.

11. A process for depositing coatings on semiconductor wafers in a vacuum reactor chamber having a gas inlet manifold electrode and a wafer support electrode of variable spacing therebetween, and for self-cleaning the chamber, comprising: repetitively depositing coatings on one or more wafers in the chamber; and applying a process for self-cleaning the internal chamber surfaces, comprising: in a first, extended etch step, supplying a fluorocarbon-containing gas into the chamber at a first chamber pressure and a first electrode spacing with selected RF power applied between the electrodes, for generating an etching plasma substantially throughout the chamber; and, in a second, local etch step, increasing the chamber pressure to a second value which is greater than the first chamber pressure, and decreasing the electrode spacing to a second value which is less than the first electrode spacing with selected power applied between the electrodes, for generating a local etching plasma between the electrodes.

12. The process of claim 11, wherein the first, extended etch step uses $C_2F_6$ and $O_2$ at a flow rate ratio of about (0.75-1.30):1, electrode spacing 750-1,000 mils, and pressure 0.8-2 torr; wherein the second, local etch step uses $C_2F_6$ and $O_2$ at a flow rate ratio of about (0.85-1):1, electrode spacing 180-350 mils and pressure 6-13 torr; and wherein the power density during both etch steps is about 2.7-5.6 watts/cm$^2$.

* * * * *